United States Patent [19]

Yoshizumi

[11] 4,431,764
[45] Feb. 14, 1984

[54] ANTISTATIC TRANSPARENT COATING COMPOSITION

[75] Inventor: Motohiko Yoshizumi, Urawa, Japan

[73] Assignee: Mitsubishi Kinzoku Kabushiki Kaisha, Japan

[21] Appl. No.: 395,065

[22] Filed: Jun. 28, 1982

[30] Foreign Application Priority Data

Nov. 18, 1980 [JP] Japan .............................. 55-162184

[51] Int. Cl.³ .............................................. C08K 3/10
[52] U.S. Cl. ................................. 524/409; 524/410; 524/411; 252/518; 428/341
[58] Field of Search ..................... 524/409, 410, 411; 252/518; 428/341

[56] References Cited

U.S. PATENT DOCUMENTS 3,923,698  12/1975  Kamigaito et al. ................. 252/518

Primary Examiner—Joseph L. Schofer
Assistant Examiner—J. M. Reddick
Attorney, Agent, or Firm—Wenderoth, Lind & Ponack

[57] ABSTRACT

An antimony-containing tin oxide wherein the content of antimony is 0.1 to 20% by weight is almost white and excels in electric conductivity. By mixing a powder of this antimony-containing tin oxide of a particle size of 0.4 μm or less with a binder resin in a specific ratio, an antistatic coating composition can be obtained. By applying this coating on nonconductive base materials such as electronic/electrical parts and building members, an antistatic effect can be imparted to these base materials without impairing their color tones.

12 Claims, 2 Drawing Figures

ANTISTATIC TRANSPARENT COATING COMPOSITION

TECHNICAL FIELD

This invention relates to a coating composition which provides a transparent coating film having antistatic property.

BACKGROUND ART

In recent years, the need for antistatic properties in containers for storing semiconductor integrated circuits and large scale integrated circuits, other electronic-/electrical parts and building materials such as carpets, floor materials and wall materials has been rapidly increasing.

A simple, well known method for imparting antistatic properties to base materials and members used for applications such as mentioned above, involves painting an electroconductive coating on these base materials and members. As examples of such an electroconductive coating are those with which an electroconductive filler such as carbon or a metal is compounded and those comprising an ion-conductive organic substance such as an alkylamine halide. However, the former products have a drawback in that the color of the coating film becomes grayish or blackish, whereby the color of the base material is impaired and also the interior part cannot be seen. The latter products also have a drawback in that, although a transparent film is provided, the antistatic effect of the film is exhibited sufficiently only in a highly humid atmosphere and is apt to be lost. Furthermore, there is also known a method wherein, on a base material such as a plastic film, there is formed a transparent, electroconductive film of $In_2O_3$, $SnO_2$, Au, Cr or the like by the vacuum deposition method, the sputtering method or the like. This method is costly, and the electroconductive film tends to peel off.

DISCLOSURE OF THE INVENTION

In view of the above described problems associated with the conventional art, this invention is intended to provide a coating composition which, by application on a nonconductive base material, can produce a coating film possessing (1) transparency not impairing the color tone of the base material, (2) excellent adhesion with respect to the base material, and (3) excellent antistatic properties.

In the course of the research relating to the above objective, the present inventor has made the following findings (a) through (d).

(a) A powder of in oxide (may be represented by $SnO_2$ hereinafter) has a whitish color and possesses electroconductivity. When it contains antimony, its electroconductivity is increased further, and the mixture is thermally stable.

(b) For the transparency and color tone of a resin not to be impaired by the addition of a powder, it is necessary that the powder added does not absorb light, that is, its color is close to white and its light refractive index is close to that of the resin (1.6 to 1.7), that the powder's particle size is 0.4 $\mu$m or smaller, that is, smaller than the wavelength of visible light, and that there occurs only little light scattering.

(c) The powder of $SnO_2$ containing Sb has a light refractive index of 2.0 to 2.1. Therefore, when this powder is added to a coating containing a binder resin in order to impart electroconductivity to the coating while maintaining the coating's color tone, particularly transparency, the powder must be fine so as to have a particle size of 0.4 $\mu$m or smaller, preferably 0.2 $\mu$m or smaller.

(d) The above particle sizes are obtained when the powder is in a dispersed condition in the coating, and therefore the powder must possess good dispersibility. That is to say, the powder is usually in aggregated state even if its specific surface diameter calculated from its specific surface area is small, and therefore transparency cannot be obtained if the powder cannot be dispersed in the coating.

The antistatic, transparent coating composition of this invention is based on the above findings. More particularly, it is characterized by comprising a binder resin and an electroconductive powder of a quantity of 5 to 90% by weight based on the total quantity of the binder and the powder, the electroconductive powder comprising an antimony-containing tin oxide, wherein the antimony content is 0.1 to 20% by weight, and having a particle size of 0.4 $\mu$m or smaller. In the coating composition of the present invention, because the antimony-containing tin oxide constituting the electroconductive powder possesses excellent electroconductivity, has a color close to white, and is of fine particle size of 0.4 $\mu$m or smaller, a coating film obtained by applying this composition is substantially transparent and imparts excellent antistatic property to the base material without impairing the color tone thereof. In addition, because the electroconductive powder used in this invention is electron-conductive, the present composition provides a coating film of stable electroconductivity not affected by variations in temperature and humidity.

Hereinunder, the present invention is described in more detail. In the following description "%" and "part" are based on weight, unless otherwise mentioned.

As the binder resins, thermoplastic resins or thermosetting resins employed in ordinary coatings, such as acrylic resins, vinyl acetate resins, vinyl chloride resins, carbonate resins, polyester resins, urethane resins, epoxy resins, polypropylene resins and styrene resins are used. Among these, polyester resins, acrylic resins, urethane resins and vinyl chloride resins are preferable from the standpoint of providing a coating film of excellent transparency; and polycarbonate resins, epoxy resins and polypropylene resins are preferable from the standpoint of providing a coating film of good electroconductivity.

Antimony in the antimony-containing tin oxide constituting the electroconductive powder can be considered, more strictly, to assume the form of an oxide of $Sb_2O_3$, $Sb_2O_5$ or a mixture thereof. Accordingly, it may be more accurate to express the electroconductive powder as a homogeneous mixture of tin oxide and antimony oxide or a complex oxide thereof. However, in this Specification (including the claims), the constituents of the electroconductive powder in such a condition are called "antimony-containing tin oxide", and the antimony content is expressed on the elemental basis. Therefore, the remainder of the electroconductive powder is essentially tin oxide ($SnO_2$) but more exactly also includes the oxygen combined with antimony.

The antimony-containing tin oxide contains 0.1 to 20%, preferably 2.5 to 20% of antimony. When the antimony content is less than 0.1%, the electrical resistance (specific resistance) of the powder becomes high, whereby a coating film of the desired good electroconductivity, that is, sufficient antistatic property cannot be obtained. When the antimony content exceeds 20%, the powder loses its white color and becomes bluish, whereby the color tone and transparency of the coating film are impaired. The antimony content is most preferably in the range of 5 to 18%.

The electroconductive powder comprises a fine powder of the above mentioned antimony-containing tin oxide having a particle size (average particle size) of 0.4 $\mu$m or smaller. When the particle size exceeds 0.4 $\mu$m, the scattering of visible light increases, and the transparency of the coating film formed is impaired. A particularly preferable particle size of the electroconductive powder is 0.2 $\mu$m or smaller as the average particle size.

The method for producing the above mentioned electroconductive powder is basically not limited. However, the production of the above described antimony-containing tin oxide powder having good dispersibility, possessing a particle size of 0.4 $\mu$m or smaller, and containing antimony in a uniform proportion is difficult by methods such as that in which a $SnO_2$ powder and an antimony compound are calcined, that in which a tin compound and an antimony compound are mixed and the mixture is calcined, and that in which, after the calcination, co-grinding is further applied. Therefore, it is desirable that the antimony-containing tin oxide powder be produced by a co-precipitation from a common solution of a tin compound and an antimony compound.

As an example, the antimony-containing tin oxide powder can be obtained by dissolving tin chloride and antimony chloride in a single or mixed solvent of an alcohol, acetone, an aqueous hydrochloric acid solution, or the like to obtain a common solution of the above two chlorides, adding the common solution to water or an aqueous alkali solution preferably heated to about 60° to 100° C., and causing antimony-containing tin oxide ($SnO_2$) to precipitate to hydrolysis. In order to improve the crystallinity of the precipitated particles, it is preferable that the particles be calcinated in air at a temperature of about 400° to 600° C., for instance, for 1 to 4 hours.

The antimony-containing tin oxide thus obtained has generally an average particle size of 0.4 $\mu$m or smaller. This powder can be further classified to make possible the use of only smaller particles having 0.2 $\mu$m or less.

The coating composition of this invention contains such an electroconductive powder in a quantity of 5 to 90% based on the total quantity of the powder and a binder resin. When this quantity is less than 5%, the electrical resistance of the coating film formed becomes higher, and the antistatic property of the film is lowered. When the quantity exceeds 90%, the dispersion of the electroconductive powder in the coating composition becomes poor, and the transparency of the coating film is impaired. In order to obtain a coating film which has both good electroconductivity and transparency, it is particularly preferable that the electroconductive powder be contained in a range of 40 to 80% in the above definition. However, when the requirement for electroductivity is of relatively low importance and the requirement for transparency is of high importance, the range of 5 to 50% is preferably used.

The inclusion of a solvent or a dispersion medium in the coating composition of this invention is not particularly necessary as long as the binder resin as a whole is in a liquid state suited for application as a coating as, for example, in the case of liquid thermosetting resins. However, the present coating composition is ordinarily obtained by dissolving or dispersing the above mentioned binder resin in a solvent or dispersing medium such as alcohol, ester, ketone, ether or water, and adding to and mixing with the resulting solution or emulsion the electroconductive powder.

At this time, to enhance the dispersibility of the powder, it is possible to add anionic surfactants such as sodium phosphate, sodium sulfonate, sodium oleate, sodium stearate and sodium citrate; silane coupling agents such as alkylsilanes and alkoxysilanes; and titanate coupling agents such as alkyl titanates and acrylic titanates. These dispersing agents are used as necessary in the range of 0.5 to 10 parts based on 100 parts of the electroconductive powder.

To the coating composition of this invention, there may be optionally added other additives which are usually used in this class of coatings, such as plasticizers, antioxidants, ultraviolet absorbers, coloring agents, and fluorescent coloring agents. It is preferable that the quantity of these optional additives be kept up to about 10 parts based on 100 parts of the binder resin.

The antistatic coating composition of the present invention is prepared by mixing and kneading each of the above described components and adjusting the composition to a viscosity of, for instance, 5 to 200 centipoises which is appropriate for application.

The coating composition thus obtained is applied on the entire surfaces of base materials such as electrical/electronic parts, various containers and building members, or on necessary portions of these materials for preventing inconvenience caused by the generation of static electricity, by which application an antistatic coating film is formed. As the application method, preferably the spraying method, the bar coating method, or the doctor blade method is used. Ordinary coating application methods other than these may also be adopted. The application quantity may vary greatly depending upon the required antistatic effect, required coating film strength and other requirements, but generally it is in the range of 1 to 20 $g/m^2$ as a solid.

BEST MODE OF PRACTISING THE INVENTION

Figure 1:
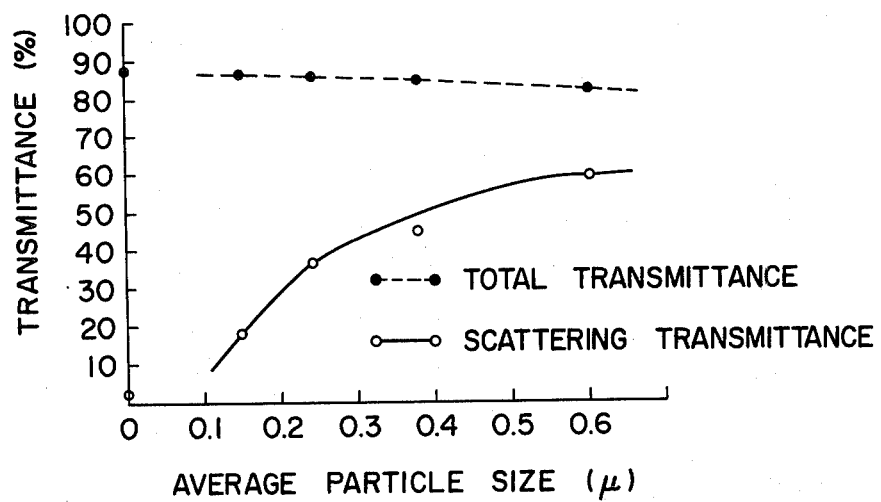
FIG. 1 is a graph showing the relationship between the light transmittance (total transmittance and scattering transmittance) of a laminate obtained by applying the coating composition of the present invention on a polyester film and the particle size of the electroconductive powder in the composition, the dotted line representing the total transmittance and the solid line the scattering transmittance.

The antistatic, transparent coating of this invention is specifically described hereinunder by reference to the following Examples.

EXAMPLE 1

Into 3,000 cc of water maintained at a temperature of 90° C., while being stirred vigorously, was poured slowly over 4 hours a solution of 173 g of $SnCl_4$ and 20.9 g of $SbCl_3$ in 150 cc of methanol to precipitate $SnO_2$ powder containing Sb. Then, the $SnO_2$ powder containing Sb was separated by filtration, washed with water, and successively subjected to heat treatment for 2 hours at a temperature of 500° C. in air in order to improve the crystallinity. Thus, a fine powder of $SnO_2$ containing Sb was produced.

The fine powder obtained contained 9.8% of Sb and a remainder comprising substantially $SnO_2$. The powder had an average particle size of $0.25\mu$.

The above operation was repeated by using 100 cc of water and also 500 cc of water in place of 3,000 cc of water, whereupon electroconductive powders having the same composition as above and average particle sizes of $0.6\mu$ and $0.38\mu$, respectively, were obtained.

All of the above three powders showed good electroconductivity with specific resistances of 1 to 2 $\Omega.cm$.

The average particle size of each powder was determined by adding 5 g of the powder to 40 cc of water, subjecting the mixture to ball milling for 10 hours, then centrifuging, and calculating from the particle size distribution obtained. The specific resistance was obtained by applying a pressure of 100 $kg/cm^2$ to the powder, measuring the resistance of the powder in the direction of the height of the sample under that pressure condition, and calculating (resistance x cross sectional area of sample)/(sample height).

7 g of each of the above three powders and a powder prepared by classifying a powder of an average particle size of 0.25 $\mu m$ by centrifugation to an average particle size of 0.15 $\mu m$ was added to a respective 40 g of a 10% solution of a polyester resin (Toyobo Byron 200) in toluene, and each mixture was stirred for 10 hours. Each coating thus obtained was applied to a thickness of 2 $\mu m$ (as a solid) on a polyester film having a 100-$\mu m$ thickness. Each coating film had a surface resistance (as measured according to ASTM D 257) of $10^7$ to $10^8$ $\Omega/\square$. Furthermore, the laminate prepared by forming the coating film had a light transmittance (as measured according to JIS K 6714) as shown in FIG. 1.

As is obvious from FIG. 1, as the average particle size of the electroconductive powder becomes larger, although the total transmittance of the coating film hardly decreases, the transmittance of scattered light (scattering transmittance) in the total transmittance increases markedly, and the straight light transmittance (total transmittance minus scattering transmittance) decreases markedly. Particularly when the average particle size exceeds $0.4\mu$, the scattering transmittance exceeds 50%, and the transparency of the film is lowered considerably.

EXAMPLE 2

The electroconductive powder obtained in Example 1 with 3,000 cc of water, containing about 9.8% of Sb with a remainder comprising substantially $SnO_2$, and having an average particle size of 0.25 $\mu m$ and a specific resistance of 2 $\Omega.cm$ was compounded with a polyester resin (Toyobo Byron 200) or urethane resin (Kansai Paint No. 2026) so that the quantity of the powder became 40 to 80% of the total quantity of the powder and the resin. To the compound was added a solvent, and, by stirring the mixture, a paint was prepared. The paint was applied on a polyester film to form a coating film of a thickness of 2 $\mu m$ (as a solid).

Figure 2:
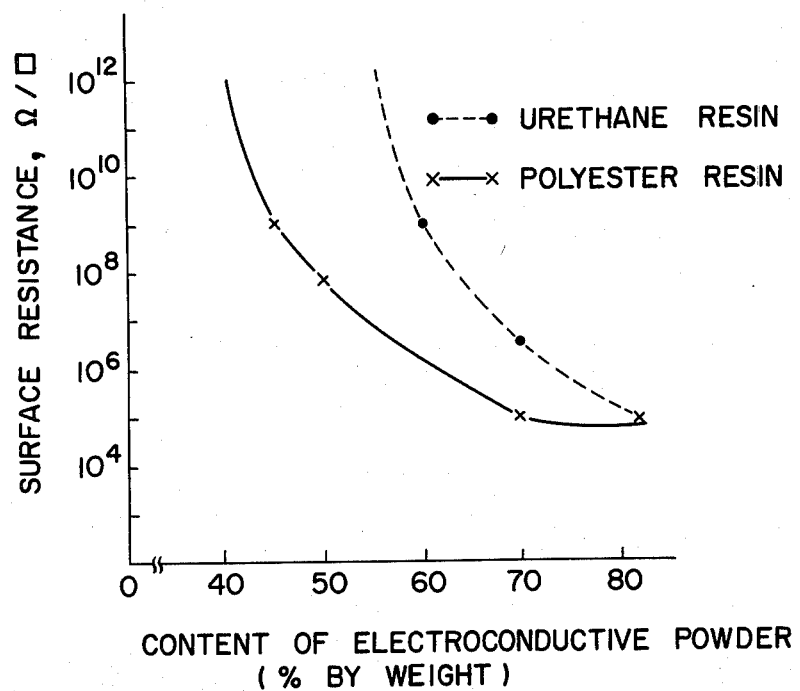
FIG. 2 is a graph showing relationships between the surface resistance of a coating film obtained by applying the coating composition of the present invention on a base material and the content of the electroconductive powder in the composition, the solid line representing the case where a polyester resin was used as a binder resin and the dotted line the case where urethane resin was used.

The surface resistance of the thus-obtained coating film was plotted against the content of the electroconductive powder, as shown in FIG. 2.

It is learned from FIG. 2 that the coating film provided by the coating composition of this invention gives an electrical conductivity higher than the level required for mere antistatic purposes.

EXAMPLE 3

Two compositions were prepared by adding an electroconductive powder which was essentially the same as that in Example 2 respectively to a polycarbonate resin paint in a proportion of 25 to 40% and to a vinyl chloride resin paint in a proportion of 50 to 70%. Using these compositions, coating films were formed by procedures similar to those in Examples 1 and 2, and their surface resistances and light transmittances were measured.

Other compositions were prepared by adding to each of the above compositions a titanate type coupling agent (Ajinomoto Prene-Art 138S) in a proportion of 5% based on the electroconductive powder, and, using these compositions, coating films were formed. Their surface resistances and light transmittance were measured in the same manner.

As a result, due to the addition of the coupling agent, although the surface resistances ($10^8$ to $10^{10}$ $\Omega/\square$) and total transmittances (70 to 80%) of the coating films hardly changed, the scattering transmittances decreased by 20 to 25% and the transparencies of the coating films were enhanced in proportion thereto.

INDUSTRIAL APPLICABILITY

As described above, the coating composition of this invention provides a coating film which is transparent and has excellent antistatic property. Accordingly, by applying this composition on non-conductive base materials such as various containers, electronic and electrical parts, and building members, this coating composition can impart a desired antistatic property to these base materials without impairing their color tones.

I claim:

1. An antistatic, transparent film-forming liquid coating composition comprising a thermoplastic or thermosetting binder resin and an electroconductive powder of 5 to 90% by weight based on the total quantity of said binder resin and said powder, said electroconductive powder comprising an antimony-containing tin oxide wherein the antimony content is 0.1 to 20% by weight and having a particle size of 0.4 $\mu m$ or less, said antimony being present as $Sb_2O_3$ or $Sb_2O_5$ or mixtures thereof.

2. A composition according to claim 1 wherein the content of the electroconductive powder is 40 to 80% based on the total quantity of the powder and the binder resin.

3. A composition according to claim 1 wherein the electroconductive powder contains 2.5 to 20% by weight of antimony.

4. A composition according to claim 1 wherein the electroconductive powder has a particle size of 0.2 $\mu m$ or less.

5. A composition according to claim 1 wherein the electroconductive powder is obtained by co-precipitation from a common solution of an antimony compound and a tin compound.

6. A composition according to claim 5 wherein the electroconductive powder is obtained by adding water or an aqueous alkali solution a common solution of antimony chloride and tin chloride and causing co-precipitation through the hydrolysis.

7. A composition according to claim 5 or 6 wherein the electroconductive powder, after co-precipitation, is further calcinated in an oxidizing atmosphere at 400° to 600° C.

8. A composition according to claim 1 which contains a dispersing agent selected from the group consisting of an anionic surfactant, a silane coupling agent, and a titanate coupling agent in a quantity of 0.5 to 10 parts by weight based on 100 parts by weight of the electroconductive powder.

9. A composition according to claim 1 wherein the binder resin is selected from an acrylic resin, a polyester resin, a polyurethane resin, a polyvinyl chloride resin, a polycarbonate resin, and a polypropylene.

10. A composition according to claim 1 which contains, in addition to the binder resin, a solvent or a dispersion medium for the binder resin and has a viscosity of 5 to 200 centipoises.

11. A method for applying an antistatic treatment to a nonconductive base material which comprises applying the coating composition of claim 1 on the nonconductive base material.

12. A method according to claim 11 wherein the coating composition is applied on the base material in a quantity of 1 to 20 g/m², as a solid.

* * * * *